(12) United States Patent
Tanabe et al.

(10) Patent No.: US 6,218,087 B1
(45) Date of Patent: Apr. 17, 2001

(54) PHOTORESIST STRIPPING LIQUID COMPOSITION AND A METHOD OF STRIPPING PHOTORESISTS USING THE SAME

(75) Inventors: Masahito Tanabe, Ishikawa-ken; Kazumasa Wakiya; Masakazu Kobayashi, both of Kanagawa-ken, all of (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/588,557

(22) Filed: Jun. 7, 2000

(30) Foreign Application Priority Data

Jun. 7, 1999 (JP) .................................................. 11-160093

(51) Int. Cl.⁷ ....................................................... G03F 7/32
(52) U.S. Cl. ................................................................ 430/331
(58) Field of Search ............................................. 430/331

(56) References Cited

U.S. PATENT DOCUMENTS

| 5,279,771 | 1/1994 | Lee ........................................ 252/548 |
| 5,334,332 | 8/1994 | Lee ........................................ 252/548 |
| 5,381,807 | 1/1995 | Lee ............................................ 134/2 |
| 5,417,877 | 5/1995 | Ward ...................................... 252/153 |
| 5,482,566 | 1/1996 | Lee .......................................... 134/42 |
| 5,496,491 | 3/1996 | Ward et al. ........................... 252/153 |
| 5,556,482 | 9/1996 | Ward et al. ............................ 134/38 |
| 5,672,577 | 9/1997 | Lee ........................................ 510/175 |
| 5,707,947 | 1/1998 | Ward et al. ........................... 510/176 |
| 5,753,601 | 5/1998 | Ward et al. ........................... 510/176 |
| 5,795,702 | 8/1998 | Tanabe et al. ........................ 430/331 |

FOREIGN PATENT DOCUMENTS

| 62-49355  | 3/1987  | (JP) . |
| 5-259066  | 10/1993 | (JP) . |
| 6-222573  | 8/1994  | (JP) . |
| 7-219240  | 8/1995  | (JP) . |
| 7-219241  | 8/1995  | (JP) . |
| 8-334905  | 12/1996 | (JP) . |
| 9-96911   | 4/1997  | (JP) . |
| 11-174690 | 7/1999  | (JP) . |

OTHER PUBLICATIONS

English Translation of JIS Z 8730, "Method for Specification of Colour Differences for Opaque Materials", pp. 599–618 (1980).

Primary Examiner—Hoa Van Le
(74) Attorney, Agent, or Firm—Wenderoth, Lind & Ponack, L.L.P.

(57) ABSTRACT

There is disclosed a photoresist stripping liquid composition of which the CIE 1976 L*a*b* color difference ($\Delta E^*_{ab}$) specified in JIS (=Japanese Industrial Standard) Z 8730 is 30–180 (as referenced to pure water). The composition is excellent not only in stripping photoresist layers and the deposition (residue) that occurs after the etching or ashing step but also in protecting substrates from corrosion even if they have metallic, inorganic or like films formed on them. An improved method of stripping photoresists using the composition is also disclosed.

10 Claims, No Drawings

PHOTORESIST STRIPPING LIQUID COMPOSITION AND A METHOD OF STRIPPING PHOTORESISTS USING THE SAME

BACKGROUND OF THE INVENTION

1. Field of the Invention

This invention relates to a photoresist stripping liquid composition and a method of stripping photoresists using the composition. More particularly, the invention relates to a liquid composition excellent not only in stripping photoresist layers and the deposition (residue) that occurs after the etching or ashing step but also in protecting substrates from corrosion having metallic, inorganic or like films formed on them. The invention also relates to a method of stripping photoresists using the composition. The invention is suitable for use in the fabrication of semiconductor devices such as ICs and LSIs, as well as liquid-crystal panel apparatus.

2. Description of Relevant Art

The fabrication of semiconductor devices such as ICs and LSIs, as well as liquid-crystal panel apparatus, comprises the steps of forming conductive metallic layers such as a tin oxide film and insulating layers such as an $SiO_2$ film on a substrate by CVD or any other suitable techniques; applying a uniform photoresist coating over the metallic layers and insulating layers; performing selective exposure and development to form a photoresist pattern; selectively etching the metallic layers and insulating layers using the photoresist pattern as a mask to form a microcircuit; and removing the unwanted photoresist layer with a liquid stripper. Other examples of the conductive metallic layers include those of aluminum (Al), aluminum alloys such as aluminum-silicon (Al-Si), aluminum-copper (Al-Cu) and aluminum-silicon-copper (Al-Si-Cu), titanium (Ti), titanium alloys such as titanium nitride (TiN) and titanium-tungsten (TiW), and copper (Cu). Also in use are inorganic films such as an amorphous silicon (a-Si) film and a polysilicon (poly-Si) film. These metallic, insulating and inorganic films are formed in one or more layers on the substrate.

While various liquid compositions have heretofore been used to strip photoresist layers, the use of liquid systems incorporating alkanolamines was recently proposed (as in Unexamined Published Japanese Patent Applications Nos. 49,355/1987 and 208,043/1988).

In the current fabrication process of semiconductor devices and liquid-crystal devices, dry etching, ashing, ion implantation and other post-treatments are applied to photoresist films, and that it becomes necessary to strip thusly treated photoresist films. Due to those post-treatments, the photoresist films become modified or deteriorated in nature. With the recent increase in the strictness of the conditions for these post-treatments, the nature of the deteriorated photoresist films tends to become inorganic than organic and, as a result, the liquid strippers using alkanolamines have turned out to be inadequate for the purpose of stripping the deteriorated photoresist films.

More recently, liquid compositions containing hydroxylamines have been proposed as systems capable of more efficient stripping of deteriorated photoresist films. For example, Unexamined Published Japanese Patent Application No. 289,866/1992 describes a photoresist stripping liquid composition containing both hydroxylamines and alkanolamines, and Unexamined Published Japanese Patent Application No. 266,119/1994 describes a photoresist stripping liquid composition containing not only hydroxylamines and alkanolamines but also a chelating agent (corrosion inhibitor) such as catechol.

These liquid compositions containing hydroxylamines have a greater ability to strip the deteriorated photoresist films than the liquid strippers containing alkanolamines. However, they cause another problem in that substrates having deposited films of Al or Al alloys such as Al-Si and Al-Si-Cu, or pure titanium (Ti) are corroded.

To avoid these problems, several proposals have been made as exemplified by the teaching of Unexamined Published Japanese Patent Application No. 96,911/1997, which discloses photoresist stripping liquid compositions comprising hydroxylamines, water, amines having a specific acid dissociation constant, water-soluble organic solvents and a specified amount of corrosion inhibitors. These compositions are excellent particularly in the capability of stripping deteriorated films and exert good corrosion-inhibiting effects on substrates having films of Al, Al alloys or pure titanium (Ti) formed thereon.

However, none of these photoresist stripping liquid compositions containing hydroxylamines have been studied for their ability to prevent corrosion of substrates having amorphous silicon, polysilicon and other inorganic films that find increasing use today, particularly in the field of liquid-crystal devices. Among such inorganic films, the polysilicon film has high mobility and is extensively used in liquid-crystal panels and other devices with a view to reducing their size. An increasing demand has therefore arisen for a photoresist stripping liquid composition that has high ability to prevent the corrosion of substrates having polysilicon and other inorganic films. In other words, it has been desired to develop a photoresist stripping liquid composition that will not corrode those substrates having various kinds of metallic layers and inorganic films for use in ICs and liquid-crystal panels and which are excellent in their ability to strip deteriorated photoresist films, as well as deposition (residue) that occurs after the etching or ashing step.

The present invention has been accomplished under these circumstances and has as an object providing a liquid composition excellent not only in stripping photoresist films and the deposition (residue) that occurs after the etching or ashing step but also in protecting substrates from corrosion even if they have metallic, inorganic or like films formed on them. Another object of the invention is to provide a method of stripping photoresists using the composition.

SUMMARY OF THE INVENTION

As a result of the intensive studies conducted to attain the stated objects, the present inventors found that those objects could be attained by a photoresist stripping liquid composition of which the CIE 1976 $L^*a^*b^*$ color difference ($\Delta E^*_{ab}$) specified in JIS (=Japanese Industrial Standard) Z 8730 is 30– 180. The present invention has been accomplished on the basis of this finding.

In the course of their study, the present inventors found that each of the aforementioned conventional hydroxylamine containing photoresist stripping liquid compositions had a color difference ($\Delta E^*_{ab}$) of no more than 20 and a light transmittance higher than 70% at 500 nm and that none of them were reasonably satisfactory in their ability to prevent corrosion of inorganic films such as a polysilicon film.

According to its first aspect, the present invention relates basically to a photoresist stripping liquid composition of which the CIE 1976 $L^*a^*b^*$ color difference ($\Delta E^*_{ab}$) which is specified in JIS (=Japanese Industrial Standard) Z 8730 and expressed by the following equation 1 is 30–180 (as referenced to pure water):

$$\Delta E^*_{ab}=[(\Delta L^*)^2+(\Delta a)^2+(\Delta b^*)^2]^{1/2} \qquad \text{(equation 1)}$$

where $\Delta L^*$, $\Delta a^*$ and $\Delta b^*$ are all specified in JIS Z 8729, $\Delta L^*$ representing the difference between the psychometric lightness values ($L^*$) of two non-luminous object colors in the CIE 1976 $L^*a^*b^*$, $\Delta a^*$ representing the difference between the values of one psychometric chroma coordinate ($a^*$) of said two non-luminous object colors, and $\Delta b^*$ representing the difference between the values of the other psychometric chroma coordinate (b*) of said two non-luminous object colors, provided that L*, a* and b* are determined by the following equations 2 and 3 where each of $X/X_n$, $Y/Y_n$ and $Z/Z_n$ is greater than 0.008856:

$$L^* = 116(Y/Y_n)^{1/3} - 16 \qquad \text{(equation 2)}$$

(where Y is a tristimulus value in the CIE 1931 standard colorimetric system, and $Y_n$ is the Y value of a perfect reflecting diffuser under standard light);

$$a = 500[(X/X_n)^{1/3} - (Y/Y_n)^{1/3}]$$

$$b^* = 200[(Y/Y_n)^{1/3} - (Z/Z_n)^{1/3}] \qquad \text{(equation 3)}$$

(where X, Y and Z are tristimulus values in the CIE 1931 standard colorimetric system, and $X_n$, $Y_n$ and $Z_n$ are the tristimulus values of a perfect reflecting diffuser in the CIE 1931 standard calorimetric system).

In a preferred embodiment, the photoresist stripping liquid composition has a CIE 1976 L*a*b* color difference ($\Delta E^*_{ab}$) of 50–140.

In another preferred embodiment, the photoresist stripping liquid composition has a light transmittance of no more than 70% (cell length=1 cm) at 500 nm.

In yet another preferred embodiment, the photoresist stripping liquid composition contains at least an aromatic hydroxyl compound in oxide form.

According to its second aspect, the present invention relates basically to a method of stripping photoresists which comprises the steps of:

(1) providing a photoresist layer on a substrate already having a metallic layer formed thereon;

(2) selectively exposing said photoresist layer;

(3) developing the exposed photoresist layer to form a photoresist pattern;

(4) selectively etching the substrate using the photoresist pattern as a mask;

(5) optionally ashing the-photoresist pattern after etching; and (6) stripping from the substrate the photoresist pattern after etching step or the optionally ashed photoresist pattern using the photoresist stripping liquid composition according to the first aspect of the invention.

Preferably, the substrate has an inorganic film formed in addition to the metallic layer.

DETAILED DESCRIPTION OF THE INVENTION

The values for the CIE 1976 L*a*b* color difference ($\Delta E^*_{ab}$) of the photoresist stripping liquid composition according to the first aspect of the invention are all calculated with reference to pure water.

The photoresist stripping liquid composition according to the first aspect of the invention is characterized in that its CIE 1976 L*a*b* color difference ($\Delta E^*_{ab}$) as specified in JIS Z 8730 is in the range of 30–180 (as referenced to pure water), preferably 50–140, more preferably 70–120.

The CIE 1976 L*a*b* is a standard colorimetric system recommended by the Commission International de l'Eclairage (CIE) in 1976; it is also known as the CIE 1976 (L*a*b*) color space and can abbreviated to CIELAB.

In the present invention, the CIE 1976 L*a*b* color difference ($\Delta E^*_{ab}$) specified in JIS Z 8730 is calculated by the following equation 1:

$$\Delta E^*_{ab} = [(\Delta L^*)^2 + (\Delta a^*)^2 + (\Delta b^*)^2]^{1/2} \qquad \text{(equation 1)}$$

where $\Delta L^*$, $\Delta a^*$ and $\Delta b^*$ are all specified in JIS Z 8729, $\Delta L^*$ representing the difference between the psychometric lightness values (L*) of two non-luminous object colors in the CIE 1976 L*a*b*, $\Delta a^*$ representing the difference between the values of one psychometric chroma coordinate (a*) of said two non-luminous object colors, and $\Delta b^*$ representing the difference between the values of the other psychometric chroma coordinate (b*) of said two non-luminous object colors, provided that L*, a* and b* are determined by the following equations 2 and 3, which are specified in JIS Z 8729, and in which each of $X/X_n$, $Y/Y_n$ and $Z/Z_n$ is greater than 0.008856:

$$L^* = 116(Y/Y_n)^{1/3} - 16 \qquad \text{(equation 2)}$$

(where Y is a tristimulus value in the CIE 1931 standard colorimetric system, and $Y_n$ is the Y value of a perfect reflecting diffuser under standard light);

$$a^* = 500[(X/X_n)^{1/3} - (Y/Y_n)^{1/3}]$$

$$b^* = 200[(Y/Y_n)^{1/3} - (Z/Z_n)^{1/3}] \qquad \text{(equation 3)}$$

(where X, Y and Z are tristimulus values in the CIE 1931 standard calorimetric system, and $X_n$, $Y_n$ and $Z_n$ are the tristimulus values of a perfect reflecting diffuser in the CIE 1931 standard colorimetric system).

The above-defined color difference ($\Delta E^*_{ab}$) can be measured and determined with a variety of commercially available spectrophotometers. The specific procedure starts with preparing a sample solution of the photoresist stripping liquid composition of the invention and pure water as a standard solution. They are then measured for spectral transmittance at a specified wavelength range (e.g., visible range from 380 to 780 nm) with a self-recording spectrophotometer UV-3100PC (Shimadzu Corp.) (cell length=1 cm). The measured data was input to the colorimetric software accompanying UV-3100PC and the tristimulus values X, Y and Z (in the CIE 1931 standard colorimetric system) of both the sample solution and water were calculated by the following equation 4:

$$X = K \int_{380}^{780} S(\lambda) \bar{x}(\lambda) R(\lambda) d\lambda$$

$$Y = K \int_{380}^{780} S(\lambda) \bar{y}(\lambda) R(\lambda) d\lambda$$

$$Z = K \int_{380}^{780} S(\lambda) \bar{z}(\lambda) R(\lambda) d\lambda$$

$$(K = 100 / \int_{380}^{780} S(\lambda) \bar{y}(\lambda) d\lambda) \qquad \text{(equation 4)}$$

(where $S(\lambda)$ is the spectral characteristic value of the illumination; $\bar{x}(\lambda X)$, $\bar{y}(\lambda)$ and $\bar{z}(\lambda)$ are the values of color matching functions in the CIE 1931 standard colorimetric system; $R(\lambda)$ is the spectral transmittance of the sample).

From the values of X, Y and Z, the lightness parameter L* and the chromaticity parameters a* and be are determined for both the sample solution and water by equations 2 and 3; in the final step, the color difference ($\Delta E^*_{ab}$), or the difference between the color value of the sample solution and that of pure water, is determined by equation 1.

In the photoresist stripping liquid composition of the present invention, the color difference ($\Delta E^*_{ab}$) is adjusted to lie between 30 and 180, preferably between 50 and 140, more preferably between 70 and 120; as a result, the composition is excellent not only in stripping photoresist films and the deposition (residue) that occurs after the etching or ashing step but also in protecting substrates from corrosion even if they have metallic, inorganic or like films formed on them.

For further improvement in performance, the composition is preferably adjusted to have a light transmittance of no more than 70% (cell length=1 cm) at 500 nm, more preferably no more than 50% at 500 nm.

Preferably, the photoresist stripping liquid composition of the invention having the characteristics described above is specifically exemplified by those having at least an aromatic hydroxyl compound in oxide form.

Exemplary aromatic hydroxyl compounds include phenol, cresol, xylenol, pyrocatechol(=1,2-dihydroxybenzene), tertbutylcatechol, resorcinol, hydroquinone, pyrogallol, 1,2,4-benzenetriol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid(=protocatechuic acid), 3,5-dihydroxybenzoic acid and gallic acid.

The aromatic hydroxyl compound in oxide form is any one of these hydroxyl compounds that have been oxidized to convert part or all of the phenolic —OH groups to =O group. In the present invention, 1,2-benzoquinone and tert-butyl-1,2-benzoquinone which are oxides of catechol and tert-butylcatechol, respectively, are used with advantage. The aromatic hydroxyl compounds in oxide form may be used either individually or in combination.

Incorporating the aromatic hydroxyl compounds in oxide form is preferred since it contributes to maintaining the CIE 1976 L*a*b* color difference ($\Delta E^*_{ab}$) in the high range specified by the invention. More preferably, from the viewpoint of efficiency in stripping photoresist films and preventing the corrosion of inorganic films such as a polysilicon film, the aromatic hydroxyl compound in oxide form is most preferably in admixture with the yet to be oxidized aromatic hydroxyl compound insofar as the photoresist stripping liquid composition of the invention shows a CIE 1976 L*a*b* color difference ($\Delta E^*_{ab}$) in the range of 30–180.

The method of incorporating the oxide of aromatic hydroxyl compound in the photoresist stripping liquid composition is in no way limited and a preliminarily made oxide may be added to the stripper composition or, alternatively, a yet to be oxidized aromatic hydroxyl compound may be added to the stripper composition and then oxidized to form the intended oxide.

Specific examples are as follows: (i) the aromatic hydroxyl compound is oxidized with air for a specified time to form an oxide which is then added to the stripper composition; (ii) the aromatic hydroxyl compound is added to the stripper composition and oxidized with air for a specified time to have the resulting oxide incorporated in the stripper composition; and (iii) the aromatic hydroxyl compound is added to the stripper composition and $O_2$ gas is blown into the composition to oxidize the aromatic hydroxyl compound so that its oxide is contained in the composition. The third method is preferred for the purposes of the invention.

In addition to the aromatic hydroxyl compound in oxide form, the liquid stripper composition of the invention may contain any other additives that are used in ordinary hydroxylamine containing liquid stripper compositions. These additives include but are not limited to amines having specified acid dissociation exponents (pKa). hydroxylamines, water-soluble organic solvents and water.

The photoresist stripping liquid composition of the invention may specifically be exemplified by the following systems.

[1] a system containing the aromatic hydroxyl compound, its oxide and an amine having pKa of 7.5–13 in aqueous solution at 25° C.:

In addition to the aromatic hydroxyl compound and its oxide, an amine having pKa in the stated range is incorporated in order to provide further improvement In strippability of photoresist films.

Exemplary amines include alkanolamines, such as monoethanolamine, diethanolamine, triethanolamine, 2-(2-aminoethoxy) ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, N,N'-diethylethylenediamine, 1,4-butanediamine, N-ethylethylenediamine, 1,2-propanediamine, 1,3-propanediamine and 1,6-hexanediamine; aliphatic amines, such as 2-ethylhexylamine, dioctylamine, tributylamine, tripropylamine, triallylamine, heptylamine and cyclohexylamine; aromatic amines, such as benzylamine and diphenylamine; and cyclic amines, such as piperazine, N-methylpiperazine, methylpiperazine and hydroxyethylpiperazine. Among these amines, monoethanolamine, 2-(2-aminoethoxy)ethanol, diethylenetriamine, triethylenetetramine, cyclohexylamine and piperazine are preferred from the viewpoint of corrosion inhibition and strippability.

The aromatic hydroxyl compound and its oxide are preferably contained in the stripper composition in an amount of 2–20 wt %, more preferably 5–15 wt %, as calculated for the aromatic hydroxyl compound. The amine having pKa of 7.5–13 in aqueous solution at 25° C. is preferably contained in the stripper composition in an amount of at least 2 wt %, more preferably at least 5 wt %. To achieve even greater improvement in the strippability of photoresist films, water may optionally be added.

[2] a system containing the aromatic hydroxyl compound, its oxide, an amine having pKa of 7.5–13 in aqueous solution at 25° C. and a hydroxylamine:

In addition to the aromatic hydroxyl compound and its oxide, the amine described in [1] which has pKa of 7.5–13 in aqueous solution at 25° C. and a hydroxylamine are incorporated to achieve further improvement in the strippability of photoresist films.

The hydroxylamine is represented by the following general formula (I):

were $R^1$ and $R^2$ each independently a hydrogen atom or a lower alkyl group having 1–6 carbon atoms.

The lower alkyl group having 1–6 carbon atoms may be exemplified by methyl, ethyl, propyl, isopropyl, butyl, isobutyl, sec-butyl, tert-butyl, pentyl, isopentyl, neopentyl, tert-pentyl, hexyl, isohexyl, 3-methylpentyl, 2,2-dimethylbutyl and 2,3-dimethylbutyl. In the formula (I), $R^1$ and $R^2$ may be the same as or different from each other.

Specific examples of the hydroxylamine include hydroxylamine ($NH_2OH$), N-methylhydroxylamine, N,N-dimethylhydroxylamine and N,N-diethylhydroxylamine, among which hydroxylamine ($NH_2OH$) is preferred. These hydroxylamines may be used either independently or in combination with themselves.

These hydroxylamines intrinsically contain water but, if desired, extra water may be added to adjust the concentration and stripping property of the composition.

The aromatic hydroxyl compound and its oxide are preferably contained in the stripper composition in an amount of 2–20 wt %, more preferably 5–15 wt %, as calculated for the aromatic hydroxyl compound. The amine having pKa of 7.5–13 in aqueous solution at 25° C. is preferably contained in the stripper composition in an amount of at least 2 wt %, more preferably at least 5 wt %. The hydroxylamine is preferably contained in the stripper composition in an amount of 2–30 wt %, more preferably 5–25 wt %. The balance is water.

[3] a system containing the aromatic hydroxyl compound, its oxide, an amine having pKa of 7.5–13 in aqueous solution at 25° C. and a water-soluble organic solvent:

In addition to the aromatic hydroxyl compound and its oxide, the amine described in [1] which has pKa of 7.5–13 in aqueous solution at 25° C. and a water-soluble organic solvent are incorporated to achieve further improvement in the strippability of photoresist films.

The water-soluble organic solvent suffices to be miscible with water and one can use any water-soluble organic solvents that are incorporated in conventional organic amine-containing liquid strippers.

Examples of water-soluble organic solvents include sulfoxides, such as dimethyl sulfoxide; sulfones, such as dimethyl sulfone, diethyl sulfone, bis(2-hydroxyethyl) sulfone and tetramethylene sulfone; amides, such as N,N-dimethylformamide, N-methylformamide, N,N-dimethylacetamide, N-methylacetamide and N,N-diethylacetamide; lactams, such as N-methyl-2-pyrrolidone, N-ethyl-2-pyrrolidone, N-propyl-2-pyrrolidone, N-hydroxymethyl- 2-pyrrolidone and N-hydroxyethyl-2-pyrrolidone; imidazolidinones, such as 1,3-dimethyl-2-imidazolidinone, 1,3-diethyl-2-imidazolidinone and 1,3-diisoproyl-2-imidazolidinone; and polyhydric alcohols, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether and diethylene glycol monobutyl ether, and derivatives thereof. These organic solvents may be used alone or in combination with one another. Preferable among these examples are dimethylsulfoxide, N,N-dimethylformamide, N,N-dimethylacetamide, N-methyl-2-pyrrolidone, 1,3-dimethyl-2-imidazolidinone and diethylene glycol monobutyl ether, which effectively remove deteriorated photoresist films. Of these examples, dimethyl sulfoxide is particularly desirable because of its good anticorrosive effect on substrates.

The aromatic hydroxyl compound and its oxide are preferably contained in the stripper composition in an amount of 2–20 wt %, more preferably 5–15 wt %, as calculated for the aromatic hydroxyl compound. The amine having pKa of 7.5–13 in aqueous solution at 25° C. is preferably contained in the stripper composition in an amount of at least 2 wt %, more preferably at least 5 wt %. The water-soluble organic solvent is preferably contained in the stripper composition in an amount of 20–80 wt %, more preferably 25–70 wt %. To achieve even greater improvement in the strippability of photoresist films, water may also be added.

[4) a system containing the aromatic hydroxyl compound, its oxide, an amine having pKa of 7.5–13 in aqueous solution at 25° C., a hydroxylamine and a water-soluble organic solvent:

In addition to the aromatic hydroxyl compound and its oxide, the amine described in 1] which has pKa of 7.5–13 in aqueous solution at 25° C., the hydroxylamine described in [2], and the water-soluble organic solvent described in [3] are incorporated. A liquid stripper composition containing all of these ingredients feature good balance between stripping and corrosion-inhibiting properties so that it is not only efficient in removing photoresist films after ion implantation or ashing but also effective in protecting all kinds of metallic layers and inorganic films from corrosion.

The aromatic hydroxyl compound and its oxide are preferably contained in the stripper composition in an amount of 2–20 wt %, more preferably 5–15 wt %, as calculated for the aromatic hydroxyl compound. The amine having pKa of 7.5–13 in aqueous solution at 25° C. is preferably contained in the stripper composition in an amount of 2–40 wt %, more preferably 5–35 wt %. The hydroxylamine is preferably contained in the stripper composition in an amount of 2–30 wt %, more preferably 5–15 wt %. The water-soluble organic solvent is preferably contained in the stripper composition in an amount of 20–80 wt %, more preferably 25–70 wt %. The balance is water.

The photoresist stripping liquid composition of the invention may further contain a benzotriazole-based compound.

Any benzotriazole-based compounds may bemused insofar as they have a benzotriazole skeleton. Specifically, compounds represented by the following general formula (II) are used with preference:

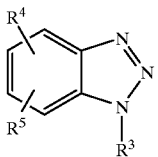

(II)

[where $R^3$ is a hydrogen atom, a hydroxyl group or a substituted or unsubstituted hydrocarbon group of 1–10 carbon atoms (provided that said hydrocarbon group may have an amide bond or ester bond in the structure) or an aryl group; $R^4$ and $R^5$ are each independently a hydrogen atom, a substituted or unsubstituted hydrocarbon group of 1–10 carbon atoms, a carboxyl group, an amino group, a hydroxyl group, a cyano group, a formyl group, a sulfonylalkyl group or a sulfo group].

The substituted hydrocarbon group may be exemplified by a hydroxyalkyl group and an alkoxylalkyl group.

In the general formula (I), $R^3$ preferably give specific examples of a hydrogen atom, an alkyl group of 1–3 carbon atoms (i.e., methyl, ethyl, propyl or isopropyl), a hydroxyalkyl group.

Specific examples of the benzotriazole-based compounds include benzotriazole, 5,6-dimethylbenzotriazole, 1-hydroxybenzotriazole, 1-methylbenzotriazole, 1-aminobenzotriazole, 1-phenylbenzo-triazole, 1-hydroxymethylbenzotriazole, 1-benzotriazole-methyl carboxylate, 5-benzotriazole-carboxylic acid, 1-methoxybenzotriazole, 1-(2,2-dihydroxyethyl)benzotriazole, 1-(1,2-dihydroxypropyl)benzotriazole and 1-(2,3-dihydroxypropyl)benzotriazole, etc. Among these, benzotriazole, 1-hydroxybenzotriazole, 1-methoxybenzotriazole, 1-(2,2-dihydroxyethyl)benzotriazole, 1-(1,2-dihydroxypropyl benzotriazole and 1-(2,3-dihydroxypropyl) benzotriazole are preferably used, and benzotriazole and 1-(1,²-dihydroxypropyl)benzotriazole are more preferred. These benzotriazole-based compounds may used either independently or in combination with themselves.

The benzotriazole-based compounds are particularly effective in preventing the corrosion of substrates having copper (Cu), polysilicon and other inorganic films formed thereon.

For further improvement in corrosion protection, acetylenic alcohols, carboxyl group containing organic compounds and anhydrides thereof may also be incorporated.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4,7,9-tetramethyl-5-decyne-4,7-diol and 2,5-dimethyl-3-hexyne-2,5-diol. Among these, 2-butyne-1, 4-diol is preferred. These acetylenic alcohols may be used either independently or in combination with themselves.

Exemplary carboxyl group containing organic compounds and anhydrides thereof include formic acid, acetic acid, propionic acid, butyric acid, isobutyric acid, oxalic acid, malonic acid, succininc acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride and salicylic acid. Among these, formic acid, phthalic acid, benzoic acid, phthalic anhydride and salicylic acid are preferred, with phthalic acid, phthalic anhydride and salicylic acid being particularly preferred. These compounds may be used either independently or in combination with themselves.

These optional additives may be used either individually or in suitable combinations depending upon various factors such as the type of the photoresist composition to be used, the stripping conditions, the conditions under which a deteriorated photoresist film is formed by ashing, ion implantation or plasma treatment, and the conditions for rinsing as a post-treatment.

The photoresist stripping liquid composition according to the first aspect of the invention can advantageously be used with all photoresists, whether negative- or positive-working, that can be developed with aqueous alkaline solutions. Such photoresists include, but are not limited to, (i) a positive-working photoresist containing a naphthoquinonediazide compound and a novolak resin, (ii) a positive-working photoresist containing a compound that generates an acid upon exposure, a compound that decomposes with an acid to have a higher solubility in aqueous alkaline solutions, and an alkali-soluble resin, (iii) a positive-working photoresist containing a compound that generates an acid upon exposure and an alkali-soluble resin containing a group that decomposes with an acid to have a higher solubility in aqueous alkaline solutions, and (iv) a negative-working photoresist containing a compound that generates an acid upon illumination with light, a crosslinker, and an alkali-soluble resin.

The method of stripping photoresists according to the second aspect of the invention may be carried out in one of two schemes; in the first scheme, a photoresist pattern is formed by lithography and the photoresist film and the deposition (residue) that remain after etching are stripped; in the second scheme, the photoresist pattern is ashed and the deteriorated photoresist pattern and the deposition that remain after ashing are stripped.

Specific steps in the first approach are as follows:

(I) providing a photoresist layer on a substrate having a metallic layer already formed thereon;

(II) selectively exposing the photoresist layer;

(III) developing the exposed photoresist layer to form a photoresist pattern;

(IV) selectively etching the substrate using the photoresist pattern as a mask; and (V) stripping the photoresist pattern from the etched substrate using the photoresist stripping liquid composition according to the first aspect of the invention.

Specific steps in the second approach are as follows:

(I) providing a photoresist layer on a substrate having a metallic layer already formed thereon;

(II) selectively exposing the photoresist layer;

(III) developing the exposed photoresist layer to form a photoresist pattern;

(IV) selectively etching the substrate using the photoresist pattern as a mask;

(V) ashing the photoresist pattern; and (VI) stripping the ashed photoresist pattern from the substrate using the photoresist stripping liquid composition according to the first aspect of the invention.

The substrate having a metallic layer formed thereon may be exemplified by substrates having formed thereon films of metals including aluminum (Al); aluminum alloys, such as aluminum-silicon (Al-Si), aluminum-copper (Al-Cu) and aluminum-silicon-copper (Al-Si-Cu); titanium (Ti); titanium alloys, such as titanium nitride (TiN) and titanium-tungsten (TiW); and copper (Cu). If desired, inorganic films such as a polysilicon (poly-Si) film may also be formed over the substrate. The stripper composition of the invention is particularly suitable for use on a substrate having both a metallic layer and a polysilicon film formed thereon because it has an outstanding ability to prevent corrosion of the polysilicon film.

The coating, drying, exposing, developing, etching and ashing steps are all conventional and not limited in any particular way. Etching may be performed either wet or dry; if desired, wet and dry etching processes may be used in combination. After etching, the residue of the metallic film ("metallic deposition") and the residue of the insulating film will occur. Ashing is initially intended to remove the photoresist pattern but a portion of it occasionally remains deteriorated after ashing.

The liquid stripper composition of the invention is particularly effective in stripping the photoresist film, the deteriorated film and the residues (depositions) that remain after the etching or ashing step.

After the developing step (III) and the stripping step (V) or (VI), two conventional treatments, i.e., rinsing with pure water, a lower alcohol or the like and drying, may be applied. Depending on the type of the photoresist used, post-exposure bake may be performed as is commonly the case for chemically amplified photoresists. Post-bake may also be performed after the formation of the photoresist pattern.

The stripping process is typically performed by dipping or spraying. The time of its duration is not limited to any particular value insofar as it is long enough to achieve the intended stripping; normally, the stripping process lasts for about 10–20 minutes.

The following examples are provided for the purpose of further illustrating the present invention but are in no way to be taken as limiting. In the following description, all amounts of ingredients are expressed in percent by weight unless otherwise indicated.

EXAMPLE 1

A liquid stripper composition consisting of catechol (10 wt %), monoethanolamine (30 wt %), hydroxylamine (15 wt %), dimethyl sulfoxide (30 wt %) and water (15 wt %) [for the recipe, see Table 1] was bubbled with $O_2$ for 2 hours at 25° C. (at an $O_2$ flow rate of 3 L/min per 200 mL of the stripper composition), whereby the catechol in the composition was the least partially oxidized to 1,2-benzoquinone.

The resulting photoresist stripping liquid composition was measured for CIE 1976 L*a*b* color difference ($\Delta E^*_{ab}$) and light transmittance (at 500 nm) by the following methods.

Measurement of $\Delta E^*_{ab}$

The photoresist stripping liquid composition and pure water as a standard solution were measured for spectral transmittance in a specified wavelength range (e.g., visible range from 380 to 780 nm) with a self-recording spectrophotometer UV-3100PC (Shimadzu Corp.) (cell length=1 cm).

The measured data was input to the calorimetric software accompanying UV-3100PC and calculations were made to determine $\Delta E^*_{ab}$. The result is shown in Table 2.

Measurement of light transmittance at 500 nm

The photoresist stripping liquid composition was measured for spectral transmittance at 500 nm with a self-recording spectrophotometer UV-3100PC (Shimadzu Corp.) (cell length=1 cm). The result is also shown in Table 2.

In the next step, a substrate having an Al-Si layer and a polysilicon (poly-Si) film formed on it was spin coated with THMR-iP3300 (Tokyo Ohka Kogyo Co., Ltd.) which was a positive-acting photoresist composition consisting of a naphthoquinone diazide compound and a novolak resin; the coating was prebaked at 90° C. for 90 seconds to form a photoresist 2.0 μm thick. The photoresist layer was exposed to NSR-2005i10D (Nikon Corp.) through a mask pattern and developed with 2.38 wt % tetramethylammonium hydroxide (TMAH) in aqueous solution to form a photoresist pattern. Post-bake was then performed at 120° C. for 90 seconds.

The substrate having the photoresist pattern formed under the conditions set forth above was subjected to dry etching and immersed in the separately prepared photoresist stripping liquid composition at 80° C. for 20 minutes to strip the photoresist film.

After the stripping process, the substrate was fully rinsed with pure water and the strippability of the photoresist film and the protection of the polysilicon film against corrosion were evaluated by SEM (scanning electron microscopy). The results are shown in Table 3.

The criteria for evaluation of the strippability of the photoresist film and the protection of the polysilicon film against corrosion were as follows.

Strippabillty of the photoresist film
  O: good
  X: some residue formed
Protection of the polysilicon film against corrosion
  O: negligible corrosion
  X: extensive corrosion

EXAMPLE 2

A liquid stripper composition consisting of catechol (5 wt %), 2-(2-aminoethoxy)ethanol (65 wt %), hydroxylamine (15 wt %), and water (15 wt %) [for the recipe, see Table 1] was bubbled with $O_2$ for 2 hours at 25° C. (at an $O_2$ flow rate of 3 L/min per 200 mL of the stripper composition), whereby the catechol in the composition was partially oxidized to 1,2-benzoquinone.

The resulting photoresist stripping liquid composition was measured for CIE 1976 $L^*a^*b^*$ color difference ($\Delta E^*_{ab}$) and light transmittance (at 500 nm) by the same methods as in Example 1. The results are shown in Table 2.

The same photoresist stripping liquid composition was used to strip a photoresist film as in Example 1.

After the stripping process, the substrate was fully rinsed with pure water and the strippability of the photoresist film and the protection of the polysilicon film against corrosion were evaluated by SEM (scanning electron microscopy). The results are shown in Table 3.

EXAMPLE 3

A liquid stripper composition consisting of catechol (10 wt %), triethylenetetramine (10 wt %), hydroxylamine (15 wt %), dimethyl sulfoxide (45 wt %) and water (20 wt %) [for the recipe, see Table 1] was put into a vessel designed to increase the area of contact with air and brought into contact with air at 25° C. so that the catechol in the composition was partially oxidized to 1,2-benzoquinone.

The resulting photoresist stripping liquid composition was measured for CIE 1976 $L^*a^*b^*$ color difference ($\Delta E^*_{ab}$) and light transmittance (at 500 nm) by the same methods as in Example 1. The results are shown in Table 2.

The same photoresist stripping liquid composition was used to strip a photoresist film as in Example 1.

After the stripping process, the substrate was fully rinsed with pure water and the strippability of the photoresist film and the protection of the polysilicon film against corrosion were evaluated by SEM (scanning electron microscopy). The results are shown in Table 3.

COMPARATIVE EXAMPLES 1–3

Photoresist stripping liquid compositions as shown in Table 1 were prepared.

Each of these photoresist stripping liquid compositions was measured for CIE 1976 $L^*a^*b^*$ color difference ($\Delta E^*_{ab}$) and light transmittance (at 500 nm) by the same methods as in Example 1. The results are shown in Table 2.

The same photoresist stripping liquid compositions were used to strip a photoresist film as in Example 1.

After the stripping process, the substrate was fully rinsed with pure water and the strippability of the photoresist film and the protection of the polysilicon film against corrosion were evaluated by SEM (scanning electron microscopy). The results are shown in Table 3.

TABLE 1

| | Photoresist stripping liquid composition (wt %) | | | | | |
|---|---|---|---|---|---|---|
| | Aromatic hydroxyl compound and its oxide | Aromatic hydroxyl compound | Other components | | | |
| Example 1 | catechol/1,2-benzoquine(*) (10) | — | MEA (30) | HA (15) | DMSO (30) | $H_2O$ (15) |
| Example 2 | catechol/1,2-benzoquine(*) (5) | — | AEE (65) | HA (15) | — | $H_2O$ (15) |
| Example 3 | catechol/1,2-benzoquine(*) (10) | — | TET (10) | HA (15) | DMSO (45) | $H_2O$ (20) |
| Comparative Example 1 | — | catechol (10) | MEA (30) | HA (15) | DMSO (30) | $H_2O$ (15) |
| Comparative Example 2 | — | catechol (5) | AEE (65) | HA (17.5) | — | $H_2O$ (17.5) |
| Comparative Example 3 | — | — | MEA (17.5) | XYL(20) DHA(10) | NMP (12.5) | $H_2O$ (40) |

Note 1) catechol/1,2-benzoquinone(*): catechol partially oxidized to 1,2-benzoquinone
Note 2) MEA: monoethanolamine; AEE: 2-(2-aminoethoxy)ethanol; TET: triethylenetetramine; HA: hydroxylamine; XYL: xylytol; DHA: N,N-diethylhydroxylamine; DMSO: dimethylsulfoxide; NMP: N-methyl-2-pyrrolidone

TABLE 2

| | $\Delta E^*_{ab}$ | Light transmittance (%) |
|---|---|---|
| Example 1 | 123.32 | 4 |
| Example 2 | 84.28 | 30 |
| Example 3 | 51.62 | 56 |
| Comparative Example 1 | 11.58 | 90 |
| Comparative Example 2 | 11.00 | 85 |
| Comparative Example 3 | 0.53 | 100 |

TABLE 3

| | Strippability of photoresist film | Corrosion protection of poly-Si film |
|---|---|---|
| Example 1 | O | O |
| Example 2 | O | O |
| Example 3 | O | O |
| Comparative Example 1 | O | X |
| Comparative Example 2 | O | X |
| Comparative Example 3 | X | X |

The Al-Si layer did not corrode in any of Examples 1–3 and Comparative Examples 1–3.

In the Examples, the stripping and corrosion protecting properties of the liquid stripper composition of the invention were evaluated on the etched substrate. It should be noted that the composition was found to perform equally well when it was applied after the etching or ashing step.

COMPARATIVE EXAMPLES 4–6

Photoresist stripping liquid compositions as shown in Table 4 were prepared.

The photoresist stripping liquid compositions and pure water as a standard solution were measured for spectral transmittance in a specified wavelength range (e.g., visible range from 380 to 780 nm) with a self-recording spectrophotometer UV-3100PC (Shimadzu Corp.) (cell length=1 cm). The measured data was input to the calorimetric software accompanying UV-3100PC and calculations were made to determine $\Delta E^*_{ab}$. The results are shown in Table 4.

TABLE 4

| | Photoresist stripping liquid composition (wt %) | $\Delta E^*_{ab}$ |
|---|---|---|
| Comparative Example 4 | Monoethanolamine (30) butyl diglycol (67) benzoic acid (3) | 0.40 |
| Comparative Example 5 | monoethanolamine (30) hydroxylamine (15) dimethyl sulfoxide (30) water (15) gallic acid (10) | 17.29 |
| Comparative Example 6 | monoethanolamine (30) hydroxylamine (15) dimethyl sulfoxide (30) water (15) phthalic acid (10) | 0.50 0.50 |

Obviously, the liquid stripper compositions of Comparative Examples 4–6 which respectively contained benzoic acid, gallic acid and phthalic acid had CIE 1976 L*a*b* color differences far smaller than the lower limit of the range specified by the present invention.

As described above in detail, the present invention provides a liquid composition excellent not only in stripping photoresist films and the deposition (residue) that occurs after the etching or ashing step but also in protecting substrates from corrosion even if they have metallic, inorganic or like films formed on them. The invention also provides an efficient method of stripping photoresists using the composition.

What is claimed is:

1. A photoresist stripping liquid composition of which the CIE 1976 L*a*b* color difference ($\Delta E^*_{ab}$) which is specified in JIS (=Japanese Industrial Standard) Z 8730 and expressed by the following equation 1 is 30–180 (as referenced to pure water):

$$\Delta E^*_{ab} = [(\Delta L^*)^2 + (\Delta a^*)^2 + (\Delta b^*)^2]^{1/2} \quad \text{(equation 1)}$$

where $\Delta L^*$, $\Delta a^*$ and $\Delta b^*$ are all specified in JIS Z 8729, $\Delta L^*$ representing the difference between the psychometric lightness values (L*) of two non-luminous object colors in the CIE 1976 L*a*b*, $\Delta a^*$ representing the difference between the values of one psychometric chroma coordinate (a*) of said two non-luminous object colors, and $\Delta b^*$ representing the difference between the values of the other psychometric chroma coordinate (b*) of said two non-luminous object colors, provided that L*, a* and b* are determined by the following equations 2 and 3, where each of $X/X_n$, $Y/Y_n$ and $Z/Z_n$ is greater than 0.008856:

$$L^* = 116(Y/Y_n)^{1/3} - 16 \quad \text{(equation 2)}$$

(where Y is a tristimulus value in the CIE 1931 standard colorimetric system, and $Y_n$ is the Y value of a perfect reflecting diffuser under standard light);

$$a^* = 500[(X/X_n)^{1/3} - (Y/Y_n)^{1/3}]$$

$$b^* = 200[(Y/Y_n)^{1/3} - (Z/Z_n)^{1/3}] \quad \text{(equation 3)}$$

(where X, Y and Z are tristimulus values in the CIE 1931 standard colorimetric system, and $X_n$, $Y_n$ and $Z_n$ are the tristimulus values of a perfect reflecting diffuser in the CIE 1931 standard colorimetric system).

2. The composition according to claim 1, wherein the CIE 1976 L*a*b* color difference ($\Delta E^*_{ab}$) is 50–140.

3. The composition according to claim 1, which has a light transmittance of no more than 70% (cell length=1 cm) at 500 nm.

4. The composition according to claim 1, which contains at least an aromatic hydroxyl compound in oxide form which has part or all of the phenolic —OH groups converted to =O group.

5. A method of stripping photoresists which comprising the steps of:
(I) providing a photoresist layer on a substrate already having a metallic layer formed thereon;
(II) selectively exposing said photoresist layer;
(III) developing the exposed photoresist layer to form a photoresist pattern;
(IV) selectively etching the substrate using the photoresist pattern as a mask; and
(V) stripping the photoresist pattern from the etched substrate using the photoresist stripping liquid composition according to any one of claims 1–4.

6. The method according to claim 5, wherein the substrate has an inorganic film formed thereon in addition to the metallic layer.

7. The method according to claim 6, wherein the inorganic film is a polysilicon (poly-Si) film.

8. A method of stripping photoresists which comprises the steps of:
(I) providing a photoresist layer on a substrate already having a metallic layer formed thereon;
(II) selectively exposing said photoresist layer;
(III) developing the exposed photoresist layer to form a photoresist pattern;
(IV) selectively etching the substrate using the photoresist pattern as a mask;
(V) ashing the photoresist pattern; and
(VI) stripping the ashed photoresist pattern from the substrate using the photoresist stripping liquid composition according to any one of claims 1–4.

9. The method according to claim 8, wherein the substrate has an inorganic film formed thereon in addition to the metallic layer.

10. The method according to claim 9, wherein the inorganic film is a polysilicon (poly-Si) film.

* * * * *